US006486431B1

(12) United States Patent
Smith et al.

(10) Patent No.: US 6,486,431 B1
(45) Date of Patent: Nov. 26, 2002

(54) TOROIDAL LOW-FIELD REACTIVE GAS SOURCE

(75) Inventors: Donald K. Smith, Belmont; Xing Chen, Cambridge; William M. Holber, Winchester; Eric Georgelis, Canton, all of MA (US)

(73) Assignee: Applied Science & Technology, Inc., Wilmington, MA (US)

( * ) Notice: Subject to any disclaimer, the term of this patent is extended or adjusted under 35 U.S.C. 154(b) by 0 days.

(21) Appl. No.: 09/659,881

(22) Filed: Sep. 12, 2000

Related U.S. Application Data

(63) Continuation of application No. 08/883,281, filed on Jun. 26, 1997, now Pat. No. 6,150,628.

(51) Int. Cl.[7] .............................................. B23K 10/00
(52) U.S. Cl. ............................ 219/121.57; 219/121.43; 219/121.44; 219/121.59; 315/111.51; 156/345
(58) Field of Search ....................... 219/121.54, 121.43, 219/121.57, 121.59; 315/111.51; 156/345, 643.1, 643.6; 204/298.31

(56) References Cited

U.S. PATENT DOCUMENTS

| | | |
|---|---|---|
| 3,343,022 A | 9/1967 | Eckert ........................ 313/63 |
| 3,500,118 A | 3/1970 | Anderson |
| 3,663,361 A | 5/1972 | Yoshikawa |
| 3,987,334 A | 10/1976 | Anderson |
| 4,049,940 A | 9/1977 | Moisan et al. |
| 4,065,369 A | 12/1977 | Ogawa et al. |
| 4,088,926 A | 5/1978 | Fletcher et al. |
| 4,180,763 A | 12/1979 | Anderson |
| 4,252,609 A | 2/1981 | Kerst et al. |
| 4,285,800 A | 8/1981 | Welty |
| 4,324,611 A | 4/1982 | Vogel et al. |
| 4,350,578 A | 9/1982 | Frieser et al. |
| 4,368,092 A | 1/1983 | Steinberg et al. |
| 4,431,898 A * | 2/1984 | Reinberg ............... 219/121.43 |

(List continued on next page.)

FOREIGN PATENT DOCUMENTS

| | | |
|---|---|---|
| JP | 61-139029 | 6/1986 |
| JP | 02260399 | 10/1990 |
| JP | 2-260399 | 10/1990 |
| JP | 5-144594 | 6/1993 |
| JP | 5-166595 | 7/1993 |
| RU | 2022917 | 11/1994 |
| SU | 957744 A1 | 2/1996 |
| WO | WO90/10945 | 9/1990 |

OTHER PUBLICATIONS

S.V. Dresvin, Physics & Tech. of Low Temp. Plasmas, H. Eckert, ed, p. 234 (1977).
H.U. Eckert, "Analysis of Thermal Induction Plasmas between Coaxial Cylinders" *J. Appl. Phys.* 43(1):46–52 (1972).
H.U. Eckert, "An Electrodeless Discharge at 60 Hz" *IEEE Trans on Plasma Sci.* PS–2:308–309 (1974).
H.U. Eckert, "The Induction Arc: A State–of–the–Art Review" *High Temp. Sci.* ,6:99–134 (1974).
H.U. Eckert, "Induction Plasmas at Low Frequencies" *AIAA Journal* 9(8):1452–1456 (1971).

(List continued on next page.)

*Primary Examiner*—Mark Paschall
(74) *Attorney, Agent, or Firm*—Testa, Hurwitz & Thibeault, LLP

(57) ABSTRACT

An apparatus for dissociating gases includes a plasma chamber that may be formed from a metallic material and a transformer having a magnetic core surrounding a portion of the plasma chamber and having a primary winding. The apparatus also includes one or more switching semiconductor devices that are directly coupled to a voltage supply and that have an output coupled to the primary winding of the transformer. The one or more switching semiconductor devices drive current in the primary winding that induces a potential inside the chamber that forms a plasma which completes a secondary circuit of the transformer.

51 Claims, 6 Drawing Sheets

U.S. PATENT DOCUMENTS

| | | | |
|---|---|---|---|
| 4,431,901 A | 2/1984 | Hull | 219/121 |
| 4,461,954 A | 7/1984 | Inoue | |
| 4,626,400 A | 12/1986 | Jassby et al. | |
| 4,631,105 A | 12/1986 | Carroll et al. | |
| 4,668,336 A | 5/1987 | Shimkunas | |
| 4,668,366 A | 5/1987 | Zarowin | |
| 4,689,192 A | 8/1987 | Nagata | |
| 4,734,247 A * | 3/1988 | Schaffer | 376/121 |
| 4,748,383 A | 5/1988 | Houkes | |
| 4,786,352 A | 11/1988 | Benzing | |
| H554 H | 12/1988 | Dawson et al. | |
| 4,793,975 A | 12/1988 | Drage | |
| 4,810,933 A | 3/1989 | Moisan et al. | |
| H627 H | 4/1989 | Peng | |
| 4,853,250 A | 8/1989 | Boulos et al. | |
| 4,859,399 A | 8/1989 | Bussard | |
| 4,859,908 A | 8/1989 | Yoshida et al. | |
| 4,878,149 A | 10/1989 | Stiehl et al. | 361/230 |
| 4,897,282 A | 1/1990 | Kniseley et al. | |
| 4,906,898 A | 3/1990 | Moisan | |
| 4,948,458 A | 8/1990 | Ogle | |
| 5,000,771 A | 3/1991 | Fleming, Jr. et al. | |
| 5,008,593 A | 4/1991 | Schlie et al. | |
| 5,016,332 A | 5/1991 | Reichelderfer, et al. | |
| 5,030,889 A | 7/1991 | El-Hamamsy et al. | |
| 5,099,100 A | 3/1992 | Bersin et al. | |
| 5,144,196 A | 9/1992 | Gegenwart et al. | |
| 5,153,484 A | 10/1992 | El-Hamamsy | |
| 5,180,150 A | 1/1993 | Prusak et al. | |
| 5,198,718 A | 3/1993 | Davis et al. | |
| 5,200,595 A | 4/1993 | Boulos et al. | |
| 5,206,516 A | 4/1993 | Keller et al. | |
| 5,254,830 A | 10/1993 | Zarowin et al. | |
| 5,280,154 A | 1/1994 | Cuomo et al. | |
| 5,290,382 A | 3/1994 | Zarowin et al. | 156/345 |
| 5,336,355 A | 8/1994 | Zarowin et al. | |
| 5,346,578 A | 9/1994 | Benzing et al. | 156/345 |
| 5,352,249 A | 10/1994 | Vollaro | |
| 5,353,314 A | 10/1994 | Schaffer | |
| 5,364,496 A | 11/1994 | Bollinger et al. | |
| 5,364,600 A | 11/1994 | Stiehl et al. | |
| 5,365,147 A | 11/1994 | Shinohara et al. | |
| 5,372,674 A | 12/1994 | Steinberg | |
| 5,394,061 A | 2/1995 | Fujii | |
| 5,397,962 A | 3/1995 | Moslehi | |
| 5,401,350 A | 3/1995 | Patrick et al. | 156/345 |
| 5,405,480 A | 4/1995 | Benzing et al. | 156/345 |
| 5,406,177 A | 4/1995 | Nerone | |
| 5,419,803 A | 5/1995 | Mumola | |
| 5,430,355 A | 7/1995 | Paranjpe | 315/111.21 |
| 5,468,296 A | 11/1995 | Patrick et al. | 118/723 |
| 5,468,955 A | 11/1995 | Chen et al. | |
| 5,472,561 A | 12/1995 | Williams et al. | |
| 5,473,291 A | 12/1995 | Brounley | |
| 5,479,072 A | 12/1995 | Dakin et al. | 313/638 |
| 5,506,507 A | 4/1996 | Schwierzke et al. | 324/464 |
| 5,514,246 A | 5/1996 | Blalock | 156/643.1 |
| 5,515,167 A | 5/1996 | Ledger et al. | |
| 5,534,231 A | 7/1996 | Savas | |
| 5,556,549 A | 9/1996 | Patrick et al. | |
| 5,563,709 A | 10/1996 | Poultney | |
| 5,565,036 A | 10/1996 | Westendorp et al. | |
| 5,567,255 A | 10/1996 | Steinberg | |
| 5,567,268 A | 10/1996 | Kadomura | |
| 5,568,015 A | 10/1996 | Holber et al. | |
| 5,585,766 A | 12/1996 | Shel | |
| 5,610,102 A | 3/1997 | Gardopee et al. | |
| 5,630,880 A | 5/1997 | Eastlund | |
| 5,637,279 A | 6/1997 | Besen et al. | |
| 5,639,519 A | 6/1997 | Patrick et al. | |
| 5,647,913 A | 7/1997 | Blalock | |
| D384,173 S | 9/1997 | Godyak et al. | |
| 5,662,819 A | 9/1997 | Kadomura | |
| 5,681,393 A | 10/1997 | Takagi | |
| 5,688,415 A | 11/1997 | Bollinger et al. | |
| 5,700,297 A | 12/1997 | Vollaro | |
| 5,767,628 A | 6/1998 | Keller et al. | |
| 5,779,849 A | 7/1998 | Blalock | |
| 5,789,867 A | 8/1998 | Westendorp et al. | |
| 5,798,016 A | 8/1998 | Oehrlein et al. | |
| 5,811,022 A | 9/1998 | Savas et al. | |
| 5,814,154 A | 9/1998 | Boitnott | |
| 5,834,905 A | 11/1998 | Godyak et al. | |
| 5,874,012 A | 2/1999 | Kanai et al. | |
| 5,883,470 A | 3/1999 | Hatakeyama et al. | |
| 5,892,198 A | 4/1999 | Barnes et al. | |
| 5,914,278 A | 6/1999 | Boitnott et al. | |
| 5,932,180 A | 8/1999 | Zhang et al. | |
| 5,965,034 A | 10/1999 | Vinogradov et al. | |
| 6,063,233 A | 5/2000 | Collins et al. | |

OTHER PUBLICATIONS

V.M. Gol'dfarb et al., "Properties of a Low–Frequency Discharge in a Transformer Plasmatron" *Teplofizika Vysokikh Temperatur* 17(4):698–702 (1979).

E. Kandler et al., "Characterization of Plasma in an Inductively Coupled High–Dense Plasma Source" *Surface Coatings & Tech.* 74 75:539–545 (1995).

V.A. Kogan et al., "Investigation of the Prospect for the Design of Transformer–Type Plasmotrons" *Teplofizika Vysokikh Temperatur* 31(1):105–110 (1993).

R.A. Krakowski et al., "Prospects for Using Low–Frequency Induction Plasmas for Bulk–Chemical Processing: A Systems Analysis" First INEL Workshop on Plasma Applications to Waste Treatment, Idaho Fall, Idaho, Jan. 16–17, 1991.

G. Soucy et al., "Parametric Study of the Decomposition of $NH_3$ for an Induction Plasma Reactor Design" *Plasma Chem. and Plasma Proc.* 15(4):693–710 (1995).

T.B. Reed, "Induction–Coupled Plasma Torch" *J. Appl. Phys.* 32(5):821–824 (1961).

T.B. Reed, "Growth of Refractory Crystals Using the Induction Plasma Torch" *J. Appl. Phys.* 32(12):2534–2535 (1961).

T.B. Reed, "Heat–Transfer Intensity from Induction Plasma Flames and Oxy–Hydrogen Flames" J. Appl. Phys. 34(8):2266–2269 (1963).

T.B. Reed, "High–Power Low–Density Induction Plasmas" *Communications* 3146–3147 (1963).

F. Maier, "Electronic Circuits for the Generation and Transfer of High–Power Pulses in Nuclear Fusion Installations" *IEEE Transactions on Plasma Science* PS–12(3): 191–198 (1984).

International Search Report dated Nov. 5, 1998 in corresponding PCT Application No. PCT/US98/13155.

Osram Endura 150W Product Information Brochure, Nov. 1996, pp. 1–4.

Akulina et al., "Injection and Confinement of Plasma in a Stellarator with a Multipolar(1=2) Helical Field," *Proceedings of Conference of International Atomic Energy Agency* (1965) pp. 733–749.

Anderson, "Electrodeless Fluorescent Lamps Excited by Solenoidal Electric Field," *IES Transaction, Illuminating Engineering* (Apr. 1969) pp. 236–242.

Ashida et al., "Measurements of Pulsed–Power Modulated Argon Plasmas in an Inductively Coupled Plasma Source," *J. Vac. Sci. Technol.*, (Mar./Apr. 1996) pp. 391–397.

Amussen, "Electron Cyclotron Resonance Microwave Discharges for Etching and Thin–Film Deposition," *Journal of Vacuum Science & Technology A: Vacuum, Surfaces, and Films*, vol. 7, No. 3 (May 1989) pp. 883–893. Abstract printed from Online Journal Publishing Service.

Bacri et al., "Influence of Departures From Complete Thermodynamic Equilibrium on Transport Coefficient Values: Application to an Oxygen Plasma," *Plasma Sources Sci. Technol.*, (1994) pp. 114–121.

Baldwin et al., "$MgF_2$ Optical Films: Ion–Beam–Assisted Deposition of Magnesium Fluoride in a Conventional Electron Beam Evaporator and the Resulting Film Properties," *Society of Vacuum Coaters: $40^{th}$ Annual Technical Conference Proceedings* (1997) pp. 1–5.

Bell, "Ring Discharge Excitation of Gas Ion Lasers," *Applied Physics Letters*, vol. 7, No. 7 (Oct. 1965), p. 190.

Benova et al., "Axial Distributions of Metastable Atoms and Charged Particles in an Ultrahigh Frequency Argon Plasma Column at Moderate Pressures," *J. Appl. Phys.*, vol. 79, No. 8 (Apr. 15, 1996) pp. 3848–3852.

Benova et al., "Theoretical Study of the Influence of a Metal Enclosure on the Parameters of a Plasma Column Sustained by a Traveling Electromagnetic Surface Wave," *Physica Scripta*, vol. 43 (1991) pp. 68–73.

Bhave et al., "Two–and Three–Body Ion–Electron Recombination Rate Coefficients in Neon*," *Aust. J. Phys.*, vol. 48 (1995) pp. 503–513.

Bishop et al., "Power Balance Measurements and Particle Loss Rate in Ohmically Heated Discharges in the C Stellarator," *Plasma Physics and Controlled Nuclear Fusion Research: Proceedings of Second Conference of International Atomic Energy Agency*, vol. 2 (1996) pp. 673–685.

Bluem et al., "Spatial Investigation of a Large Diameter Microwave Plasma," *J. Phys. D. Appl. Phys.* vol. 28 (1995) pp. 1529–1533.

Böhle et al., "On the Influence of Excited Atoms on the Electron Kinetics of a Surface Wave Sustained Argon Plasma," *Plasma Sources Sci. Technol.* vol. 3 (1994) pp. 80–87.

Boisse–Laporte et al., "Microwave Discharges Produced by Surface Waves in Argon Gas," *Journal of Physics D: Applied Physics*, vol. 20 (Feb. 14, 1987) p. 197.

Bol, "Density Fluctuations in the Etude Stellarator," *The Physics of Fluids*, vol. 7, No. 11 (Nov. 1964) pp. 1855–1856.

Bollinger et al., "Rapid, Nonmechanical, Damage–Free Figuring of Optical Surfaces Using Plasma–Assisted Chemical Etching (PACE): Part I Experimental Results," *SPIE vol. 966 Advances in Fabrication and Metrology for Optics and Large Optics* (1988) pp. 82–90.

Bollinger et al., "Rapid, Non–Contact Optical Figuring of Aspheric Surfaces With Plasma Assisted Chemical Etching (PACE)," *SPIE vol. 1333 Advanced Optical Manufacturing and Testing* (1990) pp. 44–57.

Bollinger et al., "Rapid Optical Figuring of Aspherical Surfaces With Plasma Assisted Chemical Etching (PACE)," *SPIE vol. 1618 Large Optics II* (1991) pp. 14–21.

Boswell et al., "Etching of Si by $SF_6$ in a Radio Frequency Double Cathode," *Journal of Vacuum Science & Technology B: Microelectronics and Nanometer Structures*, vol. 5, No. 4 (Jul. 1987) pp. 883–888. Abstract printed from Online Journal Publishing Service.

Bourdon et al., "Three–Body Recombination Rate of Atomic Nitrogen in Low–Pressure Plasma Flows," *Physical Review E.*, vol. 54, No. 2 (Aug. 1996) pp. 1888–1898.

Carruth, Jr., et al., "Method for Determination of Neutral Atomic Oxygen Flux," *Rev. Sci. Instrum.*, vol. 61, No. 4 (1990) pp. 1211–1216.

Chen, "Industrial Applications of Low–Temperature Plasma Physics*," *Phys. Plasmas*, vol. 2, No. 6 (Jun. 1995) pp. 2164–2175.

Cherrington, "Chapter 8: DC Discharges–The Positive Column," *Gaseous Electronics and Gas Lasers* Pergamon Press –New York (1979) pp. 144–160.

Chiu et al., "What the DryScrub® System Can Do For PFC Gas Treatment?," *Electrochemical Technology Corp. Brochure* (undated).

Coburn et al., "Ion–and Electron–Assisted Gas–Surface Chemistry –An Important Effect in Plasma Etching," *Journal of Applied Physics*, vol. 50, No. 5 (May 1979) pp. 3189–3196. Abstract printed from Online Journal Publishing Service.

Cohen et al., "Induced Magnetic Field Effects in Inductively Coupled Plasmas," *Physics of Plasma*, vol. 3, No. 5 (May 1996) pp. 1839–1847. Abstract printed from Online Journal Publishing Service.

Collins et al., "Measurement of the Rate Coefficient for the Recombination of $He^+$ with Electrons*," *Physical Review A*, vol. 6, No. 4 (Oct. 1972) pp. 1545–1558.

Darchicourt et al., "Influence of the Radial Electron Density Profile on the Determination of the Characteristics of Surface–Wave–Produced Discharges," *J. Phys. D: Applied Physics*, vol. 21 (1988) pp. 293–301.

Denneman, "Determination of Electromagnetic Properties of Low–Pressure Electrodeless Inductive Discharges," *J. Phys. D: Appl. Phys.* (1990) pp. 293–298.

Eckhartt et al., "Comparison of Alkali Plasma Loss Rates in a Stellarator and in a Toroidal Device With Minimum Mean–B Properties," *Plasma Physics and controlled Nuclear Fusion Research: Proceedings of Second Conference of International Atomic Energy Agency*, vol. 2 (1966) pp. 719–731.

Evans, "Discussion (of 'Electrodeless Fluorescent Lamps Excited by Solenoidal Electric Field' by Anderson)," *IES Transaction, Illuminating Engineering* (Apr. 1969) pp. 242–244.

Feoktistov et al., "Self–Consistent Modeling of Low–Pressure RF Discharges in Oxygen Plasma," *J. Phys. D: Appl. Phys.* vol. 26 (1995) pp. 1346–1353.

Ferreira, "Theory of a Plasma Column Sustained by a Surface Wave," *J. Phys. D: Appl. Phys.* (1981) pp. 1811–1830.

Ferreira, "Modeling of a Low–Pressure Plasma Column Sustained by a Surface Wave," *J. Phys. D: Appl. Phys.*, vol. 16 (1983) pp. 1673–1685.

Ferreira, "The Similarity Laws for the Maintenance Field and the Absorbed Power per Electron in Low–Pressure Surface Wave Produced Plasmas and their Extension to HF Plasmas in General," *Physica Scripta.*, vol. 38 (1988) pp. 382–399.

Ferreira et al., "Quasi–Neutral Theory of Positive Columns in Electronegative Gases," *J. Phys. D: Appl. Phys.*, vol. 21 (1988) pp. 1403–1413.

Ferreira, "Kinetic Modeling of Microwave Discharges," *Microwave Discharges: Fundamentals and Applications*(1993) pp. 313–337.

Fiala et al., "Two–Dimensional, Hybrid Model of Low–Pressure Glow Discharges," *Physical Review E.*, vol. 49, No. 6 (Jun. 1994) pp. 5607–5622.

Fulton, "Application of Ion–Assisted–Deposition Using a Gridless End–Hall Ion Source for Volume Manufacturing of Thin–Film Optical Filters," *Optical Interference Coating: Proceedings–SPIE The International Society for Optical Engineering* (1994) pp. 374–393.

Fulton et al., "Application of Residual Stress Analysis for Ion–Assist–Deposited (IAD) Thin–Films Manufactured Using a Gridless End–Hall Ion Source," *Optical Interference Coatings: Technical Digest Series*, vol. 17 (1995) pp. 101–103.

Gallatin et al., "Predicted Polishing Behavior of Plasma Assisted Chemical Etching (PACE) From a Unified Model of the Temporal Evolution of Etched Surfaces," *SPIE Advances in Fabrication and Metrology for Optics and Large Optics*, vol. 966 (1988) pp. 98–107.

Gallatin et al., "Unified Approach to the Temporal Evolution of Surface Profiles in Solid Etch and Deposition Processes," *J. Appl. Phys.*, vol. 65, No. 12 (Jun. 1989) pp. 5078–5088.

Golant et al., "Plasma Compression by a Magnetic Field in Toroidal–Type Device," *Proceedings of Conference of International Atomic Energy Agency* (1965) pp. 830–850.

Gousset et al., "Experimental Study of a D.C. Oxygen Glow Discharge by V.U.V. Absorption Spectroscopy," *Plasma Chemistry and Plasma Processing* vol. 7, No. 4 (1987) pp. 409–427.

Gousset et al., "Electron and Heavy–Particle Kinetics in the Low Pressure Oxygen Positive Column," *J. Phys. D: Appl. Phys.*, vol. 24 (1991) pp. 290–300.

Granier et al., "Characterization of Oyxgen Discharges," Journal of Physics D: Applied Physics, vol. 22 (1989) pp. 1487–1496.

Granier et al., "Diagnostics in $O_2$ Helicon Plasmas for $SiO_2$ Deposition," *Plasma Sources Sci. Technol.*, vol. 6 (1997) pp. 147–156.

Hartney et al., "Critical Review: Oxygen Plasma Etching for Resist Stripping and Multilayer Lithography," *J. Vac. Sci. Technol.*, pp. 1 (Jan./Feb. 1989).

Heimer et al., "Ponderomotive Transport of Charge in the Induction Plasma," *J. Vac. Sci. Technol.*, (Jan./Feb. 1994) pp. 507–511.

Henriksen et al., "Electromagnetic Field in Electrodeless Discharge," *Journal of Applied Physics*, vol. 42, No. 13 (Dec. 1971) pp. 5460–5464.

Heshmaty et al., "Approaches Explored for Producing a Variety of Ion–Assisted–Deposited Thin–Film Coatings Using an End–Hall Ion Source," *Developments in Optical Component Coatings: Proceedings of SPIE Conference*, vol. 2776 (1996) pp. 114–125.

Hopwood, "Review of Inductively Coupled Plasmas for Plasma Processing," *Plasma Sources Sci. Technol.*, (1992) pp. 109–116.

Hopwood et al., "Electromagnetic Fields in a Radio–Frequency Induction Plasma," *Journal of Vacuum Science & Technology A: Vacuum, Surfaces, and Films*, vol. 11, No. 1 (Jan. 1993) pp. 147–151. Abstract printed from Online Journal Publishing Service.

Hopwood et al., "Langmuir Probe Measurements of A Radio Frequency Induction Plasma," *Journal of Vacuum Science & Technology A: Vacuum, Surfaces, and Films*, vol. 11, No. 1 (Jan. 1993) pp. 152–156. Abstract printed from Online Journal Publishing Service.

Kita et al., "Rocket Observation of Atomic Oxygen and Night Airglow: Measurement of Concentration with an Improved Resonance Fluorescence Technique," *Annales Geophysicae*, vol. 14 (1996) 227–237.

Kolobov et al., "Electron Kinetics and Non–Joule Heating in Near–Collisionless Inductively Coupled Plasmas," *Physical Review E*, vol. 55, No. 3 (Mar. 1997) 3408–3422.

Kortshagen et al., "Determination of Electron Energy Distribution Functions in Surface Wave Produced Plasmas: I. Modeling," *J. Phys. D: Appl. Phys.*, vol. 24 (1991) pp. 1571–1584.

Kortshagen et al., "Determination of Electron Energy Distribution Functions in Surface Wave Produced Plasmas: II. Measurements," *J. Phys. D: Appl. Phys.*, vol. 24 (1991) pp. 1585–1593.

Kortshagen, "Experimental and Theoretical Determination of Electron Energy Distribution Functions in Surface Wave Plasmas," *Microwave Discharges: Fundamentals and Applications* (1993) pp. 303–312.

Kouznetsov et al., "Modeling Electronegative Discharges at Low Pressure," *Plasma Sources Science & Technology*, vol. 5, No. 4 (Nov. 1996) Abstract printed from Institute for Scientific Information.

Lee et al., "Global Model for High Pressure Electronegative Radio–Frequency Discharges," *Journal of Vacuum Science & Technology A–Vacuum Surfaces and Films* vol. 15, No. 1 (Jan.–Feb. 1997) 113–126. Abstract printed from Institute for Scientific Information.

Lichtenberg et al., "Modeling Plasma Discharges at High Electronegativity," *Plasma Sources Sci. Technol.* vol. 6 (1997) 437–449.

Lister et al., "Modeling of Inductively Coupled Discharges With Internal and External Coils," *Plasma Sources Sci. Technol.* vol. 1 (1992) 67–73.

Malik et al., "Overview of Plasma Source Ion Implantation Research at University of Wisconsin–Madison," *Journal of Vacuum Science & Technology B: Microelectronics and Nanometer Structures* vol. 12, No. 2 (Mar. 1994) 843–849. Abstract printed from Online Journal Publishing Service.

Margot et al., "Modeling of Surface–Wave–Sustained Plasmas in Static Magnetic Fields: A Tool for the Study of Magnetically Assisted HF Plasmas," *Microwave Discharges: Fundamentals and Applications* (1993) 141–159.

Michelt et al., "Measurement of the Rotational Temperature of Oxygen in a High–Power Inductively Coupled Plasma," *J. Phys. D: Appl. Phys.* vol. 28(1995) 2600–2606.

Moisan et al., "A Small Microwave Plasma Source for Long Column Production Without Magnetic Field," *IEEE Transactions on Plasma Science*, vol. PS–3, No. 2 (Jun. 1975) p. 55.

Moisan et al., "Plasma Sources Based on the Propagation of Electromagnetic Surface Waves," *J. Phys. D: Appl. Phys.* vol. 24 (1991) pp. 1025–1048.

Morrow et al., "In Situ Measurement of Atomic Nitrogen in the Ground ($^4S$) and Metastable ($^2D$) and ($^2P$) States by Resonance Fluorescence for Project Aries," *Centre for Research in Experimental Space Science* (Apr. 1981).

Niederwald et al., "IAD of Oxide Coatings at Low Temperature: A Comparison of Processes based on Different Ion Sources," *Proc. SPIE*, vol. 3133 (1997) pp. 205–213.

Okada et al., "Microwave Determination of the Coefficient of Dissociative Recombination of $Ar_2$ in AR Afterglow," *J. Phys. D: Appl. Phys.* vol. 26 (1993) 1680–1686.

Ono et al., "Effect of Annealing on Mechanical Properties of Electron–Irradiated Aluminum single Crystals at 23° K[1.]," *Applied Physics Letters* vol. 7, No. 7 (Oct. 1, 1965) p. 191.

Pawlewicz et al., "Low–Energy High–Flux Reactive Ion Assisted Deposition of Oxide Optical Coatings: Performance, Durability, Stability and Scalability," *SPIE Proceedings* 2261 (1994) 1–12.

Persson "Inertia–Controlled Ambiopolar Diffusion," *The Physics of Fluids* vol. 5, No. 12 (Dec. 1962) 1625–1632.

Persson "Brush Cathode Plasma –A Well–Behaved Plasma," *Journal of Applied Physics* vol. 36, No. 10 (Oct. 1965) 3086–3094.

Phelps "Role of Molecular Ions, Metastable Molecules, and Resonance Radiation in the Breakdown of Rare Gases," *The Physical Review* vol. 117, No. 3 (Feb. 1, 1960) 619–632.

Piejak et al., "A Simple Analysis of an Inductive RF Discharge," *Plasma Sources, Science and Technology*, vol. 1, No. 3 (1992) pp. 179–186.

Piejak et al., "The Electric Field and Current Density in a Low–Pressure Inductive Discharge Measured with Different β–dot Probes," *J. Appl. Phys.* vol. 81, No. 8 (Apr. 15, 1997) 3416–3421.

Popov "Characteristics of Electron Cyclotron Resonance Plasma Sources," *Journal of Vacuum Science & Technology A: Vacuum, Surfaces, and Films* vol. 7, No. 3 (May 1989) 894–898 Abstract printed from Online Journal Publishing Service.

Rapp et al., "Charge Exchange Between Gaseous Ions and Atoms," *The Journal of Chemical Physics* vol. 37, No. 11 (Dec. 1, 1962) 2631–2645.

Resonance Ltd., *Operation Manual for Vacuum Monochromator Model #VS2FS* (Sep. 1993).

Resonance Ltd., *Operation Manual for RF Powered Line Sources* (undated).

Sato, "Plasma Density Profile and Electron Temperature in Discharge Positive Columns at Intermediate Pressures: Examination of Ingold's Approximation," *J. Phys. D: Appl. Phys.* vol. 26 (1993) 1687–1690.

Schiffer et al., "Negative–Oxygen–Ion Detection by a Crossed–Beam Photodetachment Technique," *Plasma Sources Sci. Technol.* vol. 4 (1995) 345–352.

Self et al., "Static Theory of a Discharge Column at Intermediate Pressures," *The Physics of Fluids* vol. 9, No. 12 (Dec. 1966) 2486–2492.

Sirghi et al., "Nonlocal Particle Loss Effects on the Electron Kinetics in a Direct Current Helium Diffusion–Controlled Positive Column," *Phys. Plasmas* vol. 4, No. 4 (Apr. 1997) 1160–1165.

Smirnov et al., "Resonance Charge Transfer in Inert Gases," *Soviet Physics–Technical Physics* vol. 10, No. (1965) 83–92.

Smith, "Section 9.6: Plasma Chemistry," *Thin–Film Deposition: Principles and Practice* McGraw–Hill–New York: (1995) pp. 616–617.

Stodiek et al., "Plasma Confinement in Low–Density C Stellarator Discharges," *Proceedings of a Conference on Plasma Physics and Controlled Nuclear Fusion Research* CN–21/210, International Atomic Energy Agency (1965) pp. 687–703.

Stowers et al., "Review of Precision Surface Generating Processes and Their Potential Application to the Fabrication of Large Optical Components[*]," *SPIE Advances in Fabrication and Metrology for Optics and Large Optics*, vol. 966 (1988) pp. 62–73.

Suchel et al., "Properties of $TiO_2$ and $SiO_2$ Films Prepared by Ion–Assisted Deposition Using a Gridless End–Hall Ion Source," *Society of Vacuum Coaters*: 36th *Annual Technical Conference Proceedings* (1993) pp. 82–87.

Sugai et al., "Diagnostics and Control of Radicals in an Inductively Coupled Etching Reactor," *Journal of Vacuum Science & Technology A., Vac. Surf. Films*, vol. 13, No. 3, Pt. 1 (May/Jun. 1995) pp. 887–893.

Toader "On the Constricted Neon Positive Column," *J. Phys. D: Appl. Phys.*, vol. 28 (1995) 75–80.

Tuszewski et al., "Composition of the Oxygen Plasmas from Two Inductively Coupled Sources," *J. Vac. Sci. Technol. A* vol. 13, No. 3 (May/Jun. 1995) 839–842.

Tuszewski "An Electronegative Inductive Discharge Instability," *J. Appl. Phys.* vol. 79, No. 12 (Jun. 15, 1996) 8967–8975.

Tuszewski, "Enhanced Radio Frequency Field Penetration in an Inductively Coupled Plasma," *Physical Review Letters*, vol. 77, No. 7 (Aug. 12, 1996) 1286–1289.

Tuszewski, "Inductive Electron Heating Revisited[*]," *Phys. Plasmas* vol. 4, No. 5 (May 1997) 1922–1928.

Vahedi et al., "Analytic Model of the Ion Angular Distribution in a Collisional Sheath," *Journal of Vacuum Science & Technology A: Vacuum, Surfaces, and Films* vol. 11, No. 4 (Jul. 1993) 1275–1282. Abstract printed from Online Journal Publishing Service.

Vahedi "Modeling and Simulation of RF Discharges Used for Plasma Processing," *Dissertation Submitted in Partial Satisfaction of Requirement for Ph.D. in Electrical Engineering and Computer Science from University of California at Berkeley* (1993).

Vialle et al. "Kinetics of $O(^1S)$ and $O(^1D)$ Metastable Atoms in a DC Oxygen Glow Discharge," *J. Phys. D: Appl. Phys.*, vol. 24 (1991) pp. 301–308.

Viček, "A Collisional–Rediative Model Applicable to Argon Discharges Over a Wide Range of Conditions: Formulation and Basic Data," *J. App. D: Appl. Phys.*, vol. 22 (1989) 623–631.

Whitmer et al., "Effects of a Velocity–Dependent Collision Frequency on Wave–Plasma Interactions," *The Physics of Fluids*, vol. 9 (Apr. 1966) 768–773.

Yoshikawa et al., "Ion Heating in the C Stellarator," *Plasma Physics and Controlled Nuclear Fusion Research: Proceedings of Second Conference of International Atomic Energy Agency*, (1965) 925–939.

Zarowin et al., "Quasi–CW, High Numerical Aperture, Inductively Excited Ion Laser[*]," *Applied Physics Letters*, vol. 11, No. 2 (Jul. 15, 1967) pp. 47–48.

Zarowin, "Relation Between the RF Discharge Parameters and Plasma Etch Rates, Selectivity, and Anisotropy," *J. Vac. Science Technology* (Oct.–Dec. 1984) pp. 1537–1549.

Zarowin, "A Theory of Plasma–Assisted Checmical Vapor Transport Processes," *J. Appl. Phys.* vol. 57, No. 3 (Feb. 1985) pp. 929–942.

Zarowin et al., Rapid, Non–Mechanical, Damage Free Figuring of Optical Surfaces Using Plasma Assisted Chemical Etching (PACE): Part II Theory & Process Control, *SPIE vol. 966 Advances in Fabrication and Metrology for Optics and Large Optics* (1988) pp. 91–97.

Zarowin et al., "Rapid, Non–Contact Damage Free Shaping of Optical & Other Surfaces With Plasma Assisted Chemical Etching," *IEEE 43d Annual Symposium on Frequency Control* (1989) pp. 623–626.

Zarowin, "A Comparison Using Surface Evolution Theory of the Smoothing and Figuring of Optics by Plasma Assisted Chemical Etching and Ion Milling," *SPIE vol. 1618 Large Optics II* (1991) pp. 22–26.

Zhang et al., "Modification of the Density Profile in a Toroidal Plasma Source Using a Bias Electric Field," *Appl. Phys. Lett.*, vol. 70, No. 23 (Jun. 9, 1997) pp. 3090–3092.

Zhelyazkov et al., "Axial Structure of Low–Pressure High––Frequency Discharges Sustained by Traveling Electromagnetic Surface Waves," *Physics Reports–Review Section of Physics Letters*, (1995) pp. 79–201.

Hirose et al., "STOR II A Tokamak for Plasma Heating Studies," Plasma Physics Laboratory, University of Saskatchewan, Apr. 1981, pp. 11–14.

Osram ECG–SPOT Brochure, Feb. 1997, pp. 1–12.

Cayless et al., *"Lamp and Lighting,"* Third Edition, pp. 280–286.

"International Lighting Review, Induction Lighting," *The Global Lighting Magazine*, Apr. 1996.

"The Advanced Energy PE 2500 W, 100 kHz Generator with Load Matching User Manual," Sep. 1989.

Kassakian et al., *Principles of Power Electronics*, 1991, Chapter 1, pp. 1–8.

Lieberman et al., *Principles of Plasma Discharges and Material Processing*; Chapter 12 "Inductive Discharges," pp. 387–389.

Benesch, *Breakdown in the Pretext Tokamak*, "Chapter Two –The Machine," Jun. 1981, pp. 15–16.

Kogan et al., "Research into Potential for Creating Transformer Type Plasmatrons," *Teplofizika Vysokikh Temperatur*, vol. 31, No. 1, 1993, pp. 1–8.

Hiramatsu et al., "Generation of Strongly Ionized Aluminum Plasma in a Low–Temperature Tokamak Discharge," *Japanese Journal of Applied Physics*, vol. 31 (Jul. 1992) pp. 2243–2248.

Zhang et al., "A High Power Radio Frequency Transformer for Plasma Production in a Toroidal Plasma Source," *Rev. Sci. Instrum.*, vol. 69 (Jan. 1998) pp. 101–108.

\* cited by examiner

TOROIDAL LOW-FIELD REACTIVE GAS SOURCE

RELATED APPLICATIONS

This is a continuation of U.S. patent application Ser. No. 08/883,281 filed on Jun. 26, 1997 now U.S. Pat. No. 6,150,628.

FIELD OF THE INVENTION

This invention relates generally to the field of generating activated gas containing ions, free radicals, atoms and molecules and to apparatus for and methods of processing materials with activated gas.

BACKGROUND OF THE INVENTION

Plasma discharges can be used to excite gases to produce activated gases containing ions, free radicals, atoms and molecules. Activated gases are used for numerous industrial and scientific applications including processing solid materials such as semiconductor wafers, powders, and other gases. The parameters of the plasma and the conditions of the exposure of the plasma to the material being processed vary widely depending on the application.

For example, some applications require the use of ions with low kinetic energy (i.e. a few electron volts) because the material being processed is sensitive to damage. Other applications, such as anisotropic etching or planarized dielectric deposition, require the use of ions with high kinetic energy. Still other applications, such as reactive ion beam etching, require precise control of the ion energy.

Some applications require direct exposure of the material being processed to a high density plasma. One such application is generating ion-activated chemical reactions. Other such applications include etching of and depositing material into high aspect ratio structures. Other applications require shielding the material being processed from the plasma because the material is sensitive to damage caused by ions or because the process has high selectivity requirements.

Plasmas can be generated in various ways including DC discharge, radio frequency (RF) discharge, and microwave discharge. DC discharges are achieved by applying a potential between two electrodes in a gas. RF discharges are achieved either by electrostatically or inductively coupling energy from a power supply into a plasma. Parallel plates are typically used for electrostatically coupling energy into a plasma. Induction coils are typically used for inducing current into the plasma. Microwave discharges are achieved by directly coupling microwave energy through a microwave-passing window into a discharge chamber containing a gas. Microwave discharges are advantageous because they can be used to support a wide range of discharge conditions, including highly ionized electron cyclotron resonant (ECR) plasmas.

RF discharges and DC discharges inherently produce high energy ions and, therefore, are often used to generate plasmas for applications where the material being processed is in direct contact with the plasma. Microwave discharges produce dense, low ion energy plasmas and, therefore, are often used to produce streams of activated gas for "downstream" processing. Microwave discharges are also useful for applications where it is desirable to generate ions at low energy and then accelerate the ions to the process surface with an applied potential.

However, microwave and inductively coupled plasma sources require expensive and complex power delivery systems. These plasma sources require precision RF or microwave power generators and complex matching networks to match the impedance of the generator to the plasma source. In addition, precision instrumentation is usually required to ascertain and control the actual power reaching the plasma.

RF inductively coupled plasmas are particularly useful for generating large area plasmas for such applications as semiconductor wafer processing. However, prior art RF inductively coupled plasmas are not purely inductive because the drive currents are only weakly coupled to the plasma. Consequently, RF inductively coupled plasmas are inefficient and require the use of high voltages on the drive coils. The high voltages produce high electrostatic fields that cause high energy ion bombardment of reactor surfaces. The ion bombardment deteriorates the reactor and can contaminate the process chamber and the material being processed. The ion bombardment can also cause damage to the material being processed.

Faraday shields have been used in inductively coupled plasma sources to contain the high electrostatic fields. However, because of the relatively weak coupling of the drive coil currents to the plasma, large eddy currents form in the shields resulting in substantial power dissipation. The cost, complexity, and reduced power efficiency make the use of Faraday shields unattractive.

SUMMARY OF THE INVENTION

It is therefore a principle object of this invention to provide a source of activated gas that uses a high efficiency RF power coupling device which couples power into a plasma without the use of conventional RF or microwave generators and impedance matching systems.

It is another principle object of this invention to provide a source of activated gas for materials processing where there is no significant energetic ion bombardment within the process reactor and where long-term operation can be sustained using chemically reactive gases without damage to the source and without production of contaminant materials.

It is another principle object of this invention to provide a source of activated gas in which either a metal, a dielectric, or a coated metal (e.g. anodized) can be used to form the source chamber.

A principal discovery of the present invention is that switching semiconductor devices can be used to efficiently drive the primary winding of a power transformer that couples electromagnetic energy to a plasma so as to form a secondary circuit of the transformer. It is another principal discovery of this invention that an inductively-driven toroidal plasma source can be constructed with a metallic plasma chamber.

Accordingly, the present invention features an apparatus for dissociating gases that includes a plasma chamber. The plasma chamber may be formed from a metallic material such as aluminum or may be formed from a dielectric material such as quartz. The metallic material may be a refractory metal. The apparatus may include a process chamber that is coupled to the plasma chamber and positioned to receive reactive gas generated by a plasma in the plasma chamber.

The apparatus also includes a transformer having a magnetic core surrounding a portion of the plasma chamber and having a primary winding. One or more switching semiconductor devices are directly coupled to a voltage supply and have an output coupled to the primary winding of the transformer. The output of the one or more switching semiconductor devices may be directly coupled to the primary winding of the transformer. The one or more switching semiconductor devices may be switching transistors. The voltage supply may be a line voltage supply or a bus voltage supply.

The apparatus may include a free charge generator which assists the ignition of a plasma in the chamber. In a preferred embodiment, an electrode is positioned in the chamber to generate the free charges. In another preferred embodiment, an electrode is capacitively coupled to the chamber to generate the free charges. In another preferred embodiment, an ultraviolet light source is optically coupled to the chamber to generate the free charges.

The apparatus may include a circuit for measuring electrical parameters of the primary winding and of the plasma. The circuit measures parameters such as the current driving the primary winding, the voltage across the primary winding, the bus supply voltage, the average power in the primary winding, and the peak power in the primary winding. A power control circuit may be coupled to the circuit for measuring electrical parameters of the primary winding and the plasma. The power control circuit regulates the current flowing through the primary windings based upon a measurement of the electrical properties of the primary winding and of the plasma and from a predetermined set point representing a desired operating condition.

The present invention also features a method for dissociating gases. The method includes providing a chamber for containing a gas at a pressure. The pressure may be substantially between 1 mtorr and 100 torr. The gas may comprise a noble gas, a reactive gas or a mixture of at least one noble gas and at least one reactive gas. The method also includes providing a transformer having a magnetic core surrounding a portion of the chamber and having a primary winding.

In addition, the method includes directly coupling one or more switching semiconductor devices to a voltage supply, which may be a line voltage supply or a bus voltage supply. The one or more switching semiconductor devices are also coupled to the primary winding of the transformer so that they generate a current that drives the primary winding. The one or more switching semiconductor devices may be directly coupled to the primary winding of the transformer.

The method also includes inducing a potential inside the plasma chamber with the current in the primary winding of the transformer. The magnitude of the induced potential depends on the magnetic field produced by the core and the frequency at which the switching semiconductor devices operate according to Faraday's law of induction. The potential forms a plasma which completes a secondary circuit of the transformer. The electric field of the plasma may be substantially between 1–100 V/cm. The method may include providing an initial ionization event in the chamber. The initial ionization event may be the application of a voltage pulse to the primary winding or to an electrode positioned in the plasma chamber. The initial ionization event may also be exposing the chamber to ultraviolet radiation.

The method may include the step of measuring electrical parameters of the primary winding and of the plasma including one or more of the current driving the primary winding, the voltage across the primary winding, the bus voltage, the average power in the primary winding, and the peak power in the primary winding. In addition, the method may include the step of determining an output of the one or more switching semiconductor devices from the measurement of the electrical parameters of the primary winding, the plasma, and from a predetermined set point representing a desired operating condition.

The present invention also includes a method for cleaning a process chamber. The method includes providing a plasma chamber that is coupled to the process chamber. The plasma chamber contains a reactive gas at a pressure. A transformer is provided having a magnetic core surrounding a portion of the plasma chamber and having a primary winding. One or more switching semiconductor devices is directly coupled to a voltage supply for generating a current that drives the primary winding of the transformer.

In addition, the method includes inducing a potential inside the plasma chamber with the current in the primary winding. The magnitude of the induced potential depends on the magnetic field produced by the core and the frequency at which the switching semiconductor devices operate according to Faraday's law of induction. The potential forms a plasma which completes a secondary circuit of the transformer. The method also includes directing chemically active species such as atoms, molecules and radicals generated in the plasma from the plasma chamber into the process chamber thereby cleaning the process chamber.

The present invention also includes a method for generating reactive gases. The method includes providing a plasma chamber that is coupled to the process chamber. The plasma chamber contains a reactive gas at a pressure. A transformer is provided having a magnetic core surrounding a portion of the plasma chamber and having a primary winding. One or more switching semiconductor devices is directly coupled to a voltage supply for generating a current that drives the primary winding of the transformer.

In addition, the method includes inducing a potential inside the plasma chamber with the current in the primary winding. The magnitude of the induced potential depends on the magnetic field produced by the core and the frequency at which the switching semiconductor devices operate according to Faraday's law of induction. The potential forms a plasma which completes a secondary circuit of the transformer. The method also includes generating reactive gas in the plasma.

The present invention also features an apparatus for generating ions. The apparatus includes a plasma chamber that may be formed from a metallic material such as a refractory metal. An orifice is positioned in the chamber for directing ions generated by the plasma. A process chamber may be coupled to the orifice in the plasma chamber and adapted to receive ions generated by the plasma. Accelerating electrodes may be positioned in the process chamber for accelerating ions generated by the plasma.

The apparatus includes a transformer having a magnetic core surrounding a portion of the plasma chamber and having a primary winding. One or more switching semiconductor devices are directly coupled to a voltage supply, which may be a line voltage supply or a bus voltage supply, and have an output coupled to the primary winding of the transformer. In operation, the one or more switching semiconductor devices drives current in the primary winding of the transformer. The current induces a potential inside the chamber that forms a plasma which completes a secondary circuit of the transformer. Ions are extracted from the plasma through the orifice. The ions may be accelerated by the accelerating electrodes.

The present invention also features another apparatus for dissociating gases. The apparatus includes a plasma chamber that comprises an electrically conductive material such as aluminum and at least one dielectric region that prevents induced current flow in the chamber. The plasma chamber may include a plurality of dielectric regions separating at least two regions of the plasma chamber. The dielectric region may comprise a dielectric coating on at least one mating surface of the chamber. The plasma chamber may also include cooling channels for passing a fluid that controls the temperature of the chamber.

In addition, the apparatus includes a transformer having a magnetic core surrounding a portion of the plasma chamber and having a primary winding. The apparatus also includes a power supply that has an output electrically connected to the primary winding of the transformer. The power supply drives current in the primary winding that induces a potential inside the chamber that forms a plasma which completes a secondary circuit of the transformer. The power supply may comprise one or more switching semiconductor devices that are directly coupled to a voltage supply and that have an output coupled to the primary winding of the transformer. The voltage supply may comprise a line voltage supply or a bus voltage supply.

The apparatus may include a means for generating free charges that assists the ignition of a plasma in the chamber. In a preferred embodiment, an electrode is positioned in the chamber to generate the free charges. In another preferred embodiment, an electrode is capacitively coupled to the chamber to generate the free charges. In another preferred embodiment, an ultraviolet light source is optically coupled to the chamber to generate the free charges.

BRIEF DESCRIPTION OF THE DRAWINGS

This invention is described with particularity in the appended claims. The above and further advantages of this invention may be better understood by referring to the following description taken in conjunction with the accompanying drawings, in which:

DETAILED DESCRIPTION

Figure 1:
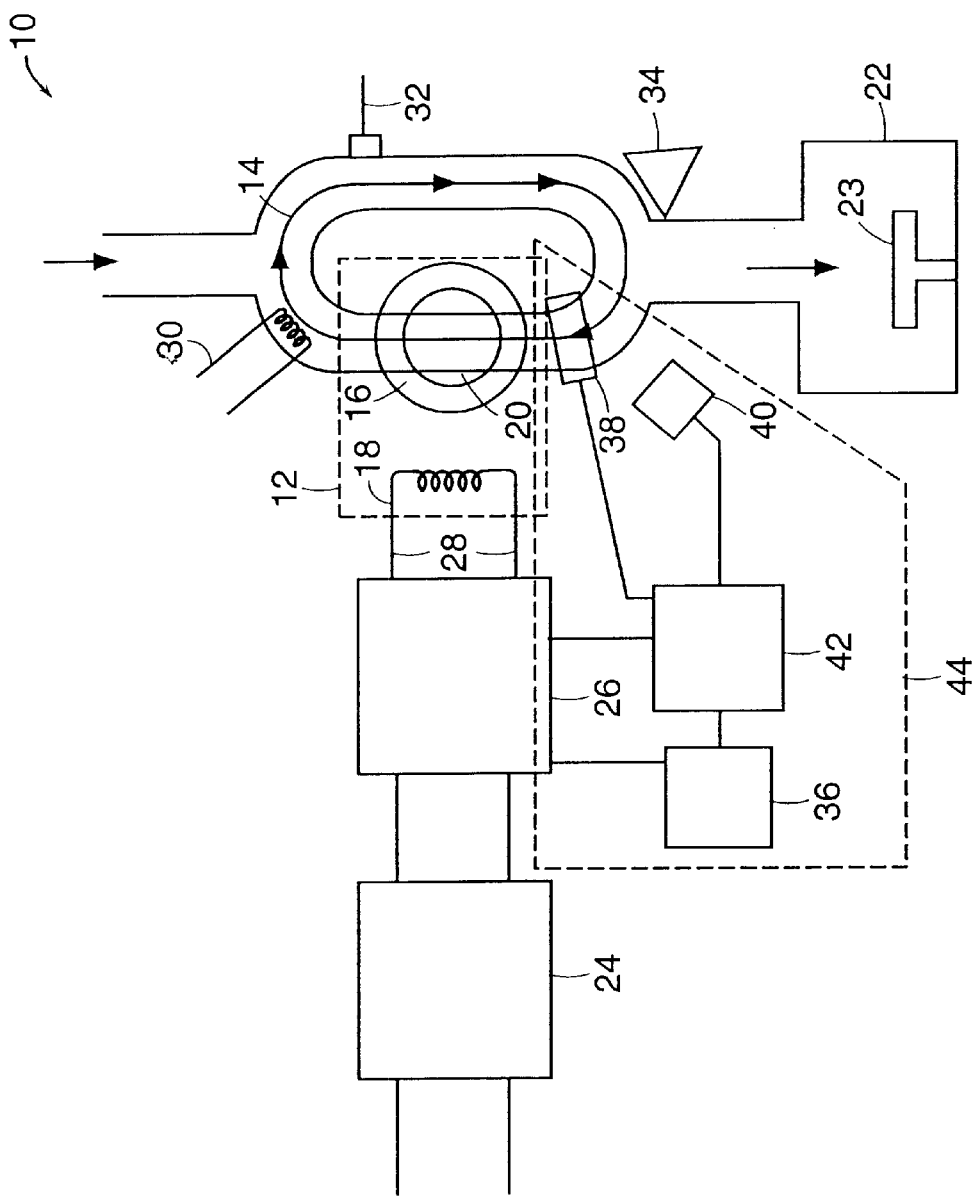
FIG. 1 is a schematic representation of a toroidal low-field plasma source for producing activated gases that embodies the invention.

FIG. 1 is a schematic representation of a toroidal low-field plasma source 10 for producing activated gases that embodies the invention. The source 10 includes a power transformer 12 that couples electromagnetic energy into a plasma 14. The power transformer 12 includes a high permeability magnetic core 16, a primary coil 18, and a plasma chamber 20 which allows the plasma 14 to form a secondary circuit of the transformer 12. The power transformer 12 can include additional magnetic cores and conductor primary coils (not shown) that form additional secondary circuits.

The plasma chamber 20 may be formed from a metallic material such as aluminum or a refractory metal, or may be formed from a dielectric material such as quartz. One or more sides of the plasma chamber 20 may be exposed to a process chamber 22 to allow charged particles generated by the plasma 14 to be in direct contact with a material to be processed (not shown). A sample holder 23 may be positioned in the process chamber 22 to support the material to be processed. The material to be processed may be biased relative to the potential of the plasma.

A voltage supply 24, which may be a line voltage supply or a bus voltage supply, is directly coupled to a circuit 26 containing one or more switching semiconductor devices. The one or more switching semiconductor devices may be switching transistors. The circuit may be a solid state switching power supply. An output 28 of the circuit 26 may be directly coupled to the primary winding 18 of the transformer 12.

The toroidal low field plasma source 10 may include a means for generating free charges that provides an initial ionization event that ignites a plasma in the plasma chamber 20. The initial ionization event may be a short, high voltage pulse that is applied to the plasma chamber. The pulse may have a voltage of approximately 500–10,000 volts and may be approximately 0.1 to 10 microseconds long. A noble gas such as argon may be inserted into the plasma chamber 20 to reduce the voltage required to ignite a plasma. Ultraviolet radiation may also be used to generate the free charges in the plasma chamber 20 that provide the initial ionization event that ignites the plasma in the plasma chamber 20.

In a preferred embodiment, the short, high voltage electric pulse is applied directly to the primary coil 18 to provide the initial ionization event. In another preferred embodiment, the short, high voltage electric pulse is applied to an electrode 30 positioned in the plasma chamber 20. In another preferred embodiment, the short, high voltage electric pulse is applied to an electrode 32 that is capacitively coupled to the plasma chamber 20 by a dielectric. In another preferred embodiment, the plasma chamber 20 is exposed to ultraviolet radiation emitting from an ultraviolet light source 34 that is optically coupled to the plasma chamber 20. The ultraviolet radiation causes the initial ionization event that ignites the plasma.

The toroidal low field plasma source 10 may also include a circuit 36 for measuring electrical parameters of the primary winding 18. Electrical parameters of the primary winding 18 include the current driving the primary winding 18, the voltage across the primary winding 18, the bus or line voltage supply generated by the voltage supply 24, the average power in the primary winding 18, and the peak power in the primary winding 18.

In addition, the plasma source 10 may include a means for measuring relevant electrical parameters of the plasma 14. Relevant electrical parameters of the plasma 14 include the plasma current and power. For example, the source 10 may include a current probe 38 positioned around the plasma chamber 20 to measure the plasma current flowing in secondary of the transformer 12. The plasma source 10 may also include an optical detector 40 for measuring the optical emission from the plasma 14. In addition, the plasma source 10 may include a power control circuit 42 that accepts data from one or more of the current probe 38, the power detector 40, and the circuit 26 and then adjusts the power in the plasma by adjusting the current in the primary winding 18.

In operation, a gas is bled into the plasma chamber 20 until a pressure substantially between 1 mtorr and 100 torr is reached. The gas may comprise a noble gas, a reactive gas or a mixture of at least one noble gas and at least one reactive gas. The circuit 26 containing switching semiconductor devices supplies a current to the primary winding 18 that induces a potential inside the plasma chamber. The magnitude of the induced potential depends on the magnetic field produced by the core and the frequency at which the switching semiconductor devices operate according to Faraday's law of induction. An ionization event that forms the plasma may be initiated in the chamber. The ionization event may be the application of a voltage pulse to the primary winding or to the electrode 30 in the chamber 20. Alternatively, the ionization event may be exposing the chamber to ultraviolet radiation.

Once the gas is ionized, a plasma is formed which completes a secondary circuit of the transformer. The electric field of the plasma may be substantially between 1–100 V/cm. If only noble gases are present in the plasma chamber 20, the electric fields in the plasma 14 may be as low as 1 volt/cm. If, however, electronegative gases are present in the chamber, the electric fields in the plasma 14 are considerably higher. Operating the plasma source 10 with low electric fields in the plasma chamber 14 is desirable because a low potential difference between the plasma and the chamber will substantially reduce erosion of the chamber by energetic ions and the resulting contamination to the material being processed.

The power delivered to the plasma can be accurately controlled by a feedback loop 44 that comprises the power control circuit 42, the circuit 36 for measuring electrical parameters of the primary winding 18 and the circuit 26 containing one or more switching semiconductor devices. In addition, the feedback loop 44 may include the current probe 38 and optical detector 40.

In a preferred embodiment, the power control circuit 42 measures the power in the plasma using the circuit 36 for measuring electrical parameters of the primary winding 18. The power control circuit 42 then compares the measurement to a predetermined setpoint representing a desired operating condition and adjusts one or more parameters of the circuit 26 to control the power delivered to the plasma. The one or more parameters of circuit 26 include pulse amplitude, frequency, pulse width, and relative phase of the drive pulses to the one or more switching semiconductor devices.

In another preferred embodiment, the power control circuit 42 measures the power in the plasma using the current probe 38 or the optical detector 40. The power control circuit 42 then compares the measurement to a predetermined setpoint representing a desired operating condition and adjusts one or more parameters of the circuit 26 to control the power delivered to the plasma.

The plasma source 10 is advantageous because its conversion efficiency of line power into power absorbed by the plasma is very high compared with prior art plasma sources. This is because the circuit 26 containing one or more switching semiconductor devices that supplies the current to the primary winding 18 is highly efficient. The conversion efficiency may be substantially greater than 90%. The plasma source 10 is also advantageous because it does not require the use of conventional impedance matching networks or conventional RF power generators. This greatly reduces the cost and increases the reliability of the plasma source.

In addition, the plasma source 10 is advantageous because it operates with low electric fields in the plasma chamber 20. Low electric fields are desirable because a low potential difference between the plasma and the chamber will substantially reduce energetic ion bombardment within the plasma chamber 20. Reducing energetic ion bombardment in the plasma chamber 20 is desirable because it minimizes the production of contaminating materials within the plasma chamber 20, especially when chemically reactive gases are used. For example, when fluorine based gases such as NF3 and CF4/O2 are used in the plasma source 10 of the present invention, including a plasma chamber formed from a fluorine resistant material, no or minimal erosion of the chamber was observed after extended exposure to the low ion temperature fluorine plasma.

The plasma source 10 is useful for processing numerous materials such as solid surfaces, powders, and gases. The plasma source 10 is particularly useful for cleaning process chambers in semiconductor processing equipment such as thin film deposition and etching systems. The plasma source 10 is also particularly useful for providing an ion source for ion implantation and ion milling systems.

In addition, the plasma source 10 is useful for providing a source for etching systems used for etching numerous materials used to fabricate semiconductor devices such as silicon, silicon dioxide, silicon nitride, aluminum, molybdenum, tungsten and organic materials such as photoresists, polyimades and other polymeric materials. The plasma source 10 is also useful for providing a source for plasma enhanced deposition of materials of numerous thin films such as diamond films, silicon dioxide, silicon nitride, and aluminum nitride.

The plasma source is also useful for generating reactive gases such as atomic fluorine, atomic chlorine and atomic oxygen. Such reactive gases are useful for reducing, converting, stabilizing or passivating various oxides such as silicon dioxide, tin oxide, zinc oxide and indium-tin oxide. Applications include fluxless soldering, removal of silicon dioxide from silicon surface and passivation of silicon surface prior to wafer processing.

Other applications of the plasma source 10 include modification of surface properties of polymers, metals, ceramics and papers. The plasma source 10 may also be used for abatement of environmentally hazardous gases including fluorine containing compounds such as CF4, NF3, C2F6, CHF3, SF6, and organic compounds such as dioxins and furans and other volatile organic compounds. In addition, the plasma source 10 may be used to generate high fluxes of atomic oxygen, atomic chlorine, or atomic fluorine for sterilization. The plasma source 10 may also be used in an atmospheric pressure torch.

Figure 2:
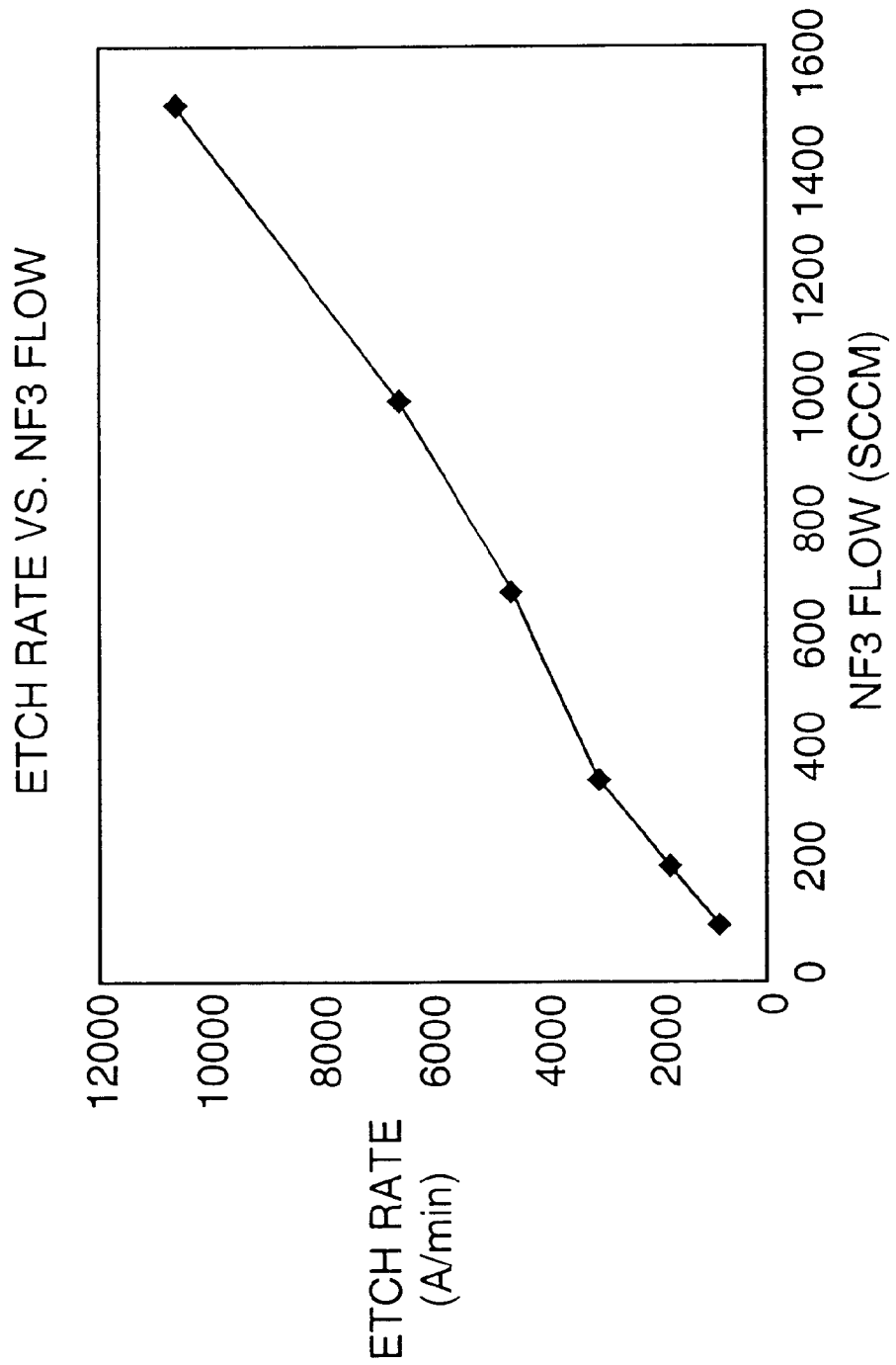
FIG. 2 illustrates a plot of etch rate of thermal silicon dioxide as a function of NF3 feed gas flow rate, using the toroidal low-field plasma source that embodies the invention.

FIG. 2 illustrates a plot of etch rate of thermal silicon dioxide as a function of NF3 feed gas flow rates using the toroidal low-field plasma source that embodies the invention. The toroidal low-field plasma source 10 was configured as a downstream atomic fluorine source. The power was approximately 3.5 kW.

Figure 3:
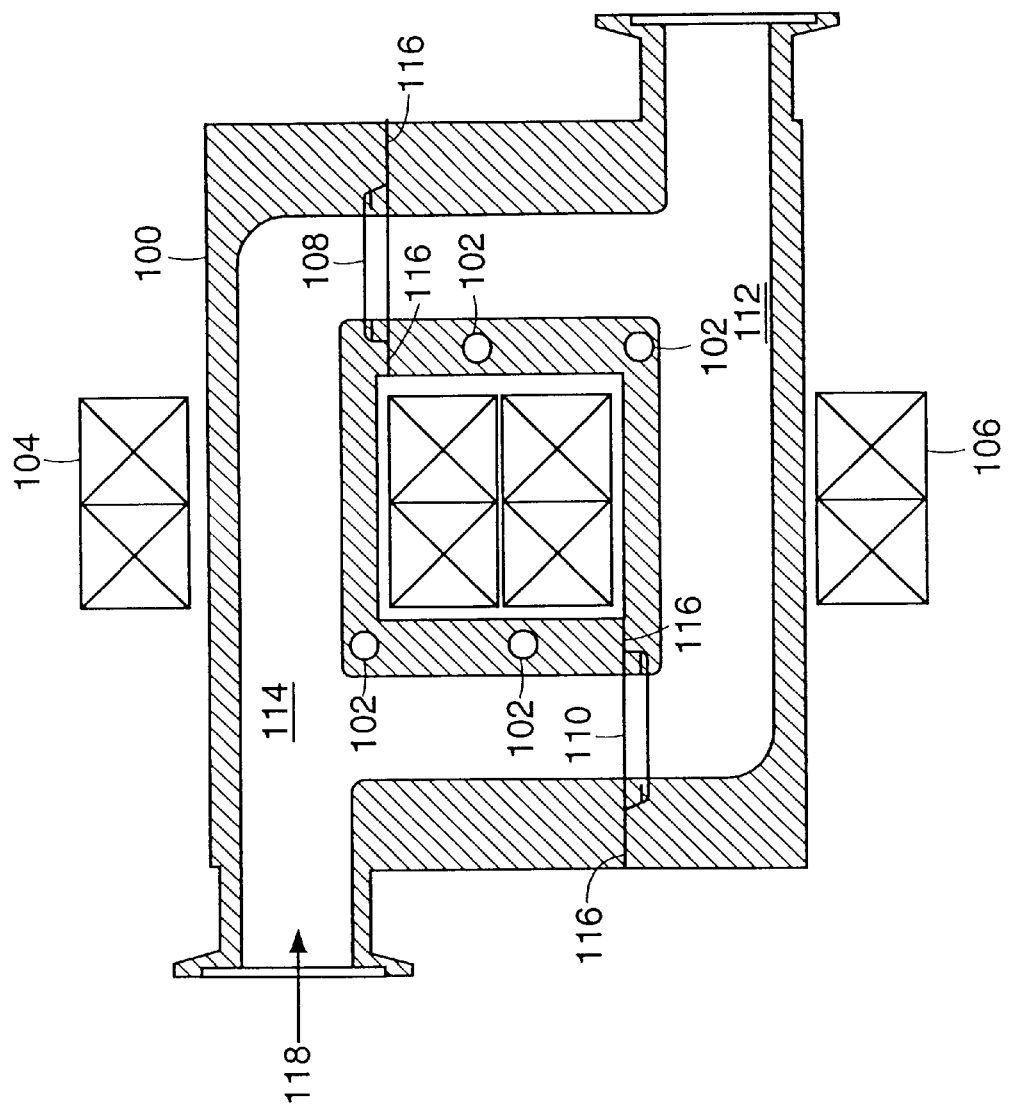
FIG. 3 is a schematic representation of a metallic plasma chamber that may be used with the toroidal low-field plasma source described in connection with FIG. 1.

FIG. 3 is a schematic representation of a metallic plasma chamber 100 that may be used with the toroidal low-field plasma source described in connection with FIG. 1. The plasma chamber 100 is formed from a metal such as aluminum, copper, nickel and steel. The plasma chamber 100 may also be formed from a coated metal such as anodized aluminum or nickel plated aluminum. The plasma chamber 100 includes imbedded cooling channels 102 for passing a fluid that controls the temperature of the plasma chamber 100.

As shown, a first 104 and a second high permeability magnetic core 106 surround the plasma chamber 100. The magnetic cores 104, 106 are part of the transformer 12 of FIG. 1. As described in connection with FIG. 1, each of the first 104 and the second core 106 induce a potential inside the chamber that forms a plasma which completes a secondary circuit of the transformer 12. Only one magnetic core is required to operate the toroidal low-field plasma source.

Applicants have discovered that an inductively-driven toroidal low-field plasma source can be made with a metallic plasma chamber. Prior art inductively coupled plasma sources use plasma chambers formed from dielectric material so as to prevent induced current flow from forming in the plasma chamber itself. The plasma chamber 100 of this invention includes at least one dielectric region that electrically isolates a portion of the plasma chamber 100 so that electrical continuity through the plasma chamber 100 is broken. The electrical isolation prevents induced current flow from forming in the plasma chamber itself.

The plasma chamber 100 includes a first 108 and a second dielectric region 110 that prevents induced current flow from forming in the plasma chamber 100. The dielectric regions 108, 110 electrically isolate the plasma chamber 100 into a first 112 and a second region 114. Each of the first 112 and the second region 114 is joined with a high vacuum seal to the dielectric regions 108, 110 to form the plasma chamber 100. The high vacuum seal may be comprised of an elastomer seal or may be formed by a permanent seal such as a brazed joint. In order to reduce contamination, the dielectric regions 108, 110 may be protected from the plasma. The dielectric regions 108, 110 may comprise a dielectric spacer separating mating surface 116 of the plasma chamber 100, or may be a dielectric coating on the mating surface 116.

In operation, a feed gas flows into an inlet 118. As described in connection with FIG. 1, each of the first 104 and the second core 106 induce a potential inside the plasma chamber 100 that forms a plasma which completes a secondary circuit of the transformer 12. Note that only one magnetic core is required to operate the toroidal low-field plasma source.

The use of metal or coated metal chambers in toroidal low-field plasma sources is advantageous because some metals are more highly resistant to certain chemicals commonly used in plasma processing, such as fluorine based gases. In addition, metal or coated metal chambers may have much higher thermal conductivity at much higher temperatures than dielectric chambers and, therefore, can generate much higher power plasmas.

Figure 4:
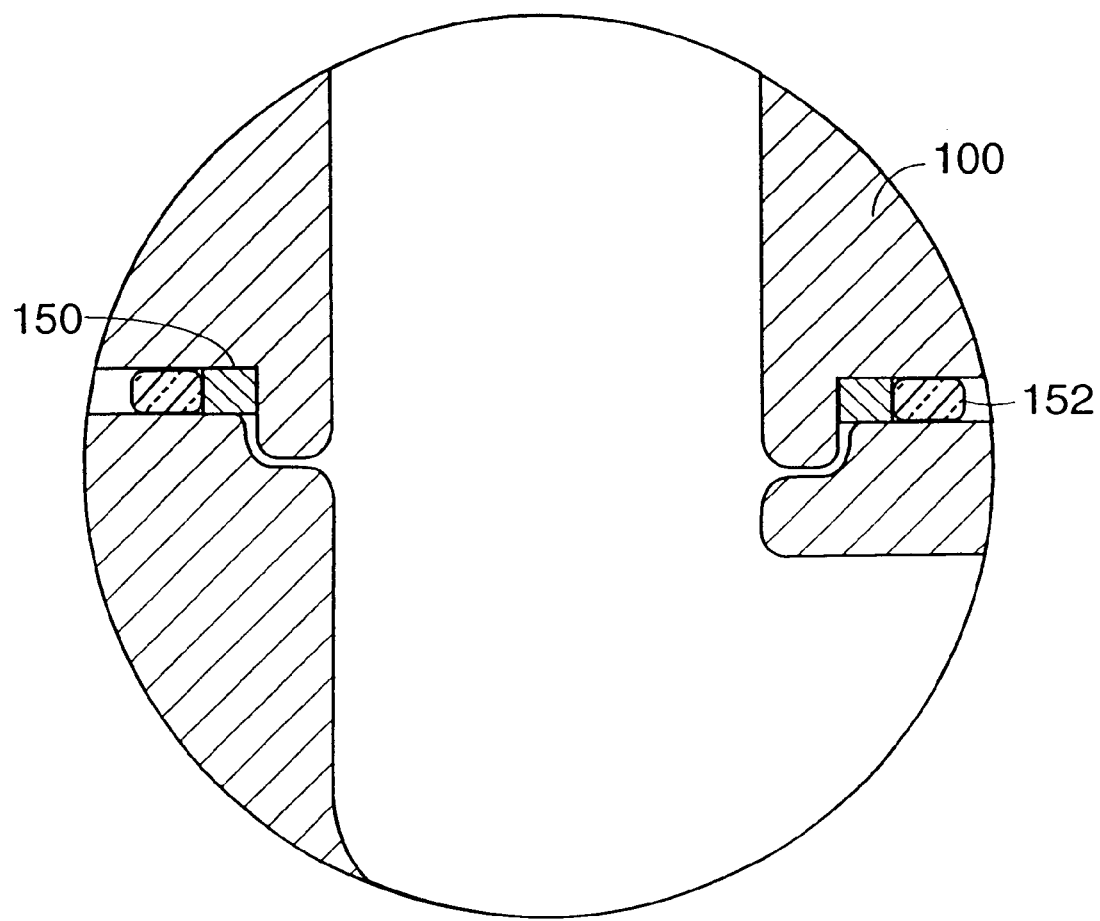
FIG. 4 is a schematic representation of a dielectric spacer suitable for the dielectric regions illustrated in FIG. 3 that prevent induced current flow from forming in the plasma chamber.

FIG. 4 is a schematic representation of a dielectric spacer 150 suitable for the dielectric regions illustrated in FIG. 3 that prevent induced current flow from forming in the plasma chamber. In this embodiment, a high vacuum seal 152 is formed outside the dielectric spacer 150. The dielectric region is protected from the plasma by protruded chamber wall 100.

Figure 5:
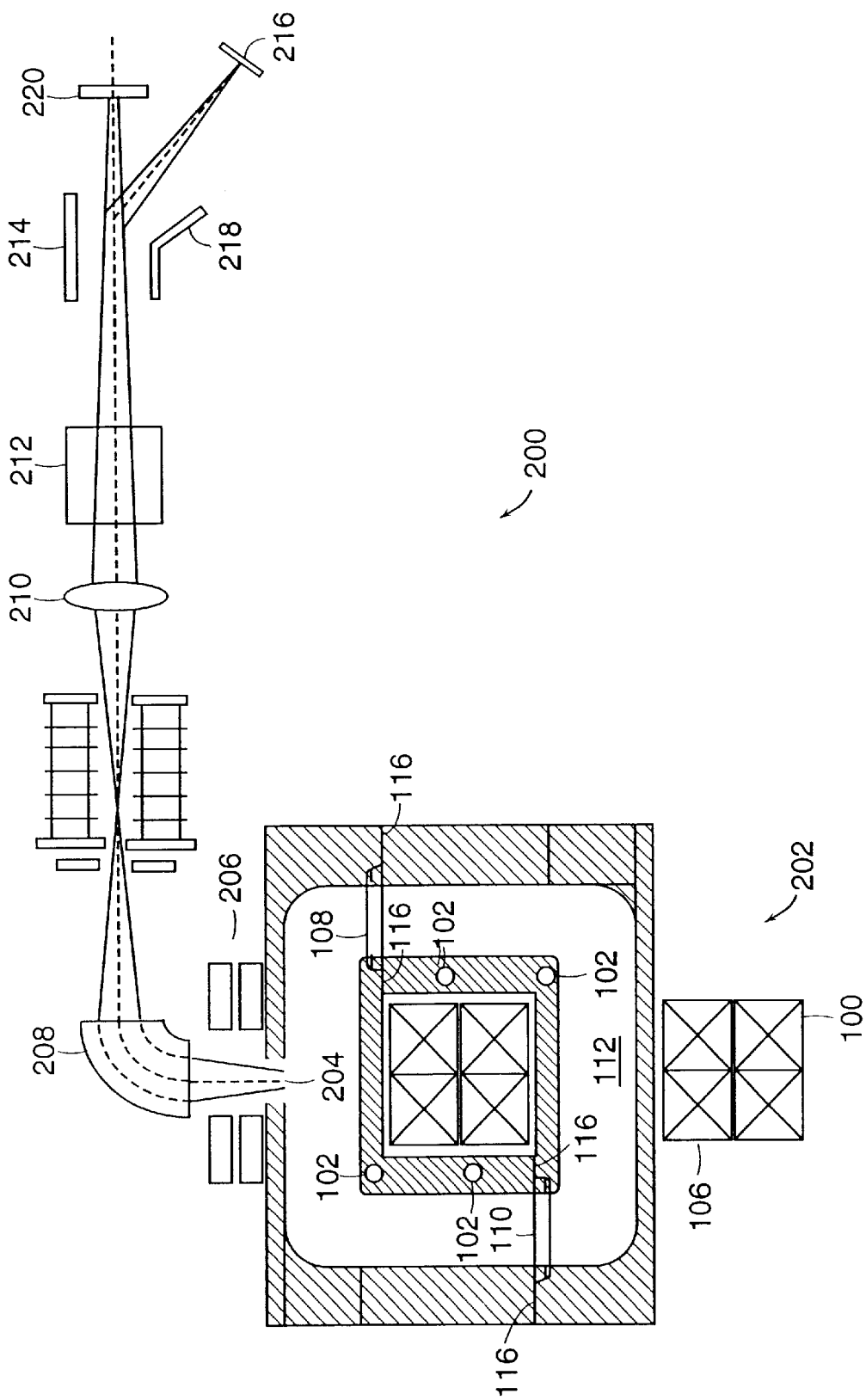
FIG. 5 is a schematic representation of a toroidal low-field ion beam source that embodies the invention and that is configured for high intensity ion beam processing.

FIG. 5 is a schematic representation of an ion beam source 200 including an toroidal low-field plasma generator that embodies the invention. The ion beam source 200 may be used for numerous ion beam processing applications including ion milling and ion implantation. The ion beam source 200 includes toroidal low field plasma source 202 comprising the metallic plasma chamber 100 described in connection with FIG. 3. The plasma chamber 100 includes a slit 204 for extracting ions generated by the plasma out of the chamber 100. Accelerating electrodes 206 accelerate the ions passing out of the chamber 100 with a predetermined electric field thereby forming an ion beam where the ions have a predetermined energy.

A mass-separating magnet 208 may be positioned in the path of the accelerated ions to select a desired ion species. A second set of accelerating electrodes may be used to accelerate the desired ion species to a predetermined high energy. An ion lens may be used to focus the high energy ion beam. A vertical 212 and a horizontal axis scanner 214 may be used to scan the ion beam across a sample 216. A deflector 218 may be used to separate the ion beam from any neutral particles so that the ion beam impacts the sample 216 and the neutral particles impact a neutral trap 220.

Figure 6:
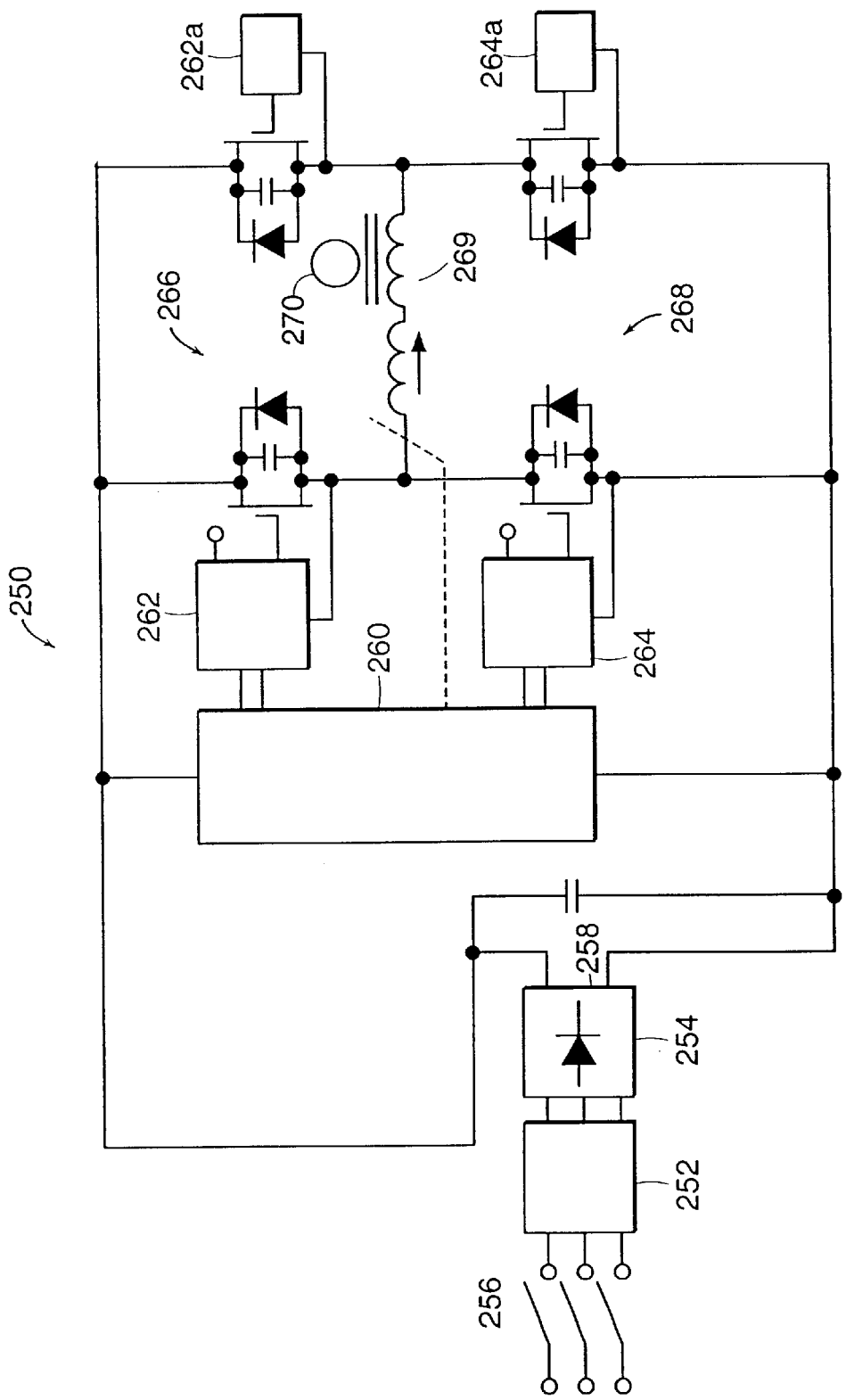
FIG. 6 is a schematic block diagram of a solid state switching power supply that includes the one or more switching semiconductor devices of FIG. 1.

FIG. 6 is a schematic block diagram of a solid state switching power supply 250 that includes the one or more switching semiconductor devices of FIG. 1. Applicants have discovered that switching semiconductor devices can be used to drive the primary winding of a power transformer that couples electromagnetic energy to a plasma so as to form a secondary circuit of the transformer.

The use of a switching power supply in toroidal low-field plasma source is advantageous because switching power supplies are much less expensive and are physically much smaller in volume and lighter in weight than the prior art RF and microwave power supplies used to power plasma sources. This is because switching power supplies do not require a line isolation circuit or an impedance matching network.

The present invention can use any switching power supply configuration to drive current in the primary winding 18 (FIG. 1). For example, the switching power supply 250 may include a filter 252 and a rectifier circuit 254 that is coupled to a line voltage supply 256. An output 258 of the filter 252 and the rectifier circuit 254 produces a DC voltage which is typically several hundred volts. The output 258 is coupled to a current mode control circuit 260.

The current mode control circuit 260 is coupled to a first 262, 262a and a second isolation driver 264, 264a. The first 262, 262a and the second isolation driver 264, 264a drives a first 266 and a second pair of switching transistors 268. The switching transistors may be IGBT or FET devices. The output of the first 266 and the second pair of switching transistors 268 may have numerous waveforms including a sinusoidal waveform. The output of the switching transistors is coupled by the primary winding and magnetic core 269 to the toroidal plasma 270 which forms the transformer secondary.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An apparatus for dissociating gases, the apparatus comprising:

a. a plasma chamber comprising a gas;

b. a transformer having a magnetic core surrounding a portion of the plasma chamber and a primary winding; and c. a solid state AC switching power supply comprising one or more switching semiconductor devices coupled to a voltage supply and having an output coupled to the primary winding, the solid state AC switching power supply driving an AC current in the primary winding, the current inducing an AC potential inside the chamber that directly forms a toroidal plasma that completes a secondary circuit of the transformer and dissociates the gas.

2. The apparatus of claim 1 wherein the one or more switching semiconductor devices comprises one or more switching transistors.

3. The apparatus of claim 1 wherein the output of the one or more switching semiconductor devices is directly coupled to the primary winding.

4. The apparatus of claim 1 wherein the chamber comprises an electrically conductive material and at least one dielectric region that forms an electrical discontinuity in the chamber.

5. The apparatus of claim 4 wherein the electrically conductive material comprises aluminum.

6. The apparatus of claim 5 wherein the aluminum is anodized.

7. The apparatus of claim 1 wherein the chamber comprises a dielectric material.

8. The apparatus of claim 1 further comprising an electrode positioned in the chamber that generates free charges that assist the ignition of a plasma in the chamber.

9. The apparatus of claim 1 further comprising an electrode capacitively coupled to the chamber that generates free charges that assist the ignition of a plasma in the chamber.

10. The apparatus of claim 1 further comprising an ultraviolet light source optically coupled to the chamber that generates free charges that assist the ignition of a plasma in the chamber.

11. The apparatus of claim 1 further comprising a circuit for measuring electrical parameters associated with the primary winding and the plasma, the electrical parameters including one or more of a current driving the primary winding, a voltage across the primary winding, an average power in the primary winding, and a peak power in the primary winding.

12. The apparatus of claim 11 further comprising a power control circuit having an input coupled to an output of the circuit for measuring electrical parameters associated with the primary winding and the plasma and an input coupled to the solid state AC switching power supply, the power control circuit controlling voltage and current supplied to the primary winding.

13. The apparatus of claim 1 further comprising a process chamber that is coupled to the plasma chamber and positioned to receive the dissociated gas generated by the plasma.

14. An apparatus for material processing, the apparatus comprising:
    a. a plasma chamber comprising a gas;
    b. a transformer having a magnetic core surrounding a portion of the plasma chamber and a primary winding;
    c. a solid state AC switching power supply comprising one or more switching semiconductor devices coupled to a voltage supply and having an output coupled to the primary winding,
    the solid state AC switching power supply driving current in the primary winding, the current inducing an AC potential inside the chamber that directly forms a toroidal plasma that completes a secondary circuit of the transformer and dissociates the gas; and
    d. a sample holder located relative to the plasma chamber and exposed to the dissociated gas.

15. The apparatus of claim 14 further comprising a power supply that is electrically coupled to the sample holder that biases the material to be processed relative to a potential of the plasma.

16. The apparatus of claim 14 wherein the sample holder is located in the plasma chamber.

17. The apparatus of claim 14 further comprising a process chamber that is coupled to the plasma chamber and that receives the dissociated gas, wherein the sample holder is located in the process chamber.

18. The apparatus of claim 14 wherein the material to be processed comprises at least one of a solid, powder, and a gas.

19. The apparatus of claim 14 wherein the material to be processed comprises a semiconductor material.

20. The apparatus of claim 14 wherein the plasma chamber comprises an electrically conductive material and at least one dielectric region that forms an electrical discontinuity in the chamber.

21. The apparatus of claim 14 further comprising an electrode positioned in the chamber that generates free charges that assist the ignition of a plasma in the chamber.

22. The apparatus of claim 14 further comprising an electrode capacitively coupled to the chamber that generates free charges that assist the ignition of a plasma in the chamber.

23. The apparatus of claim 14 further comprising an ultraviolet light source optically coupled to the chamber that generates free charges that assist the ignition of a plasma in the chamber.

24. The apparatus of claim 14 further comprising a circuit for measuring electrical parameters associated with the primary winding and the plasma, the electrical parameters including one or more of a current driving the primary winding, a voltage across the primary winding, an average power in the primary winding, and a peak power in the primary winding.

25. The apparatus of claim 14 further comprising a power control circuit having an input coupled to an output of the circuit for measuring electrical parameters associated with the primary winding and the plasma and an input coupled to the solid state AC switching power supply, the power control circuit controlling voltage and current supplied to the primary winding.

26. A method for dissociating gases, the method comprising:
    a. confining a gas in a chamber at a pressure;
    b. generating a current with a solid state AC switching power supply; and
    c. inducing an AC potential inside the chamber by passing the current though a primary winding of a transformer having a magnetic core surrounding a portion of the chamber, the induced AC potential directly forming a toroidal plasma that completes a secondary circuit of the transformer and dissociates the gas.

27. The method of claim 26 further comprising providing an initial ionization event in the chamber.

28. The method of claim 26 wherein the step of providing an initial ionization event in the chamber comprises applying a voltage pulse to the primary winding.

29. The method of claim 26 wherein the step of providing an initial ionization event in the chamber comprises exposing the chamber to ultraviolet light.

30. The method of claim 26 wherein the gas comprises at least one of a noble gas and a reactive gas.

31. The method of claim 26 further comprising measuring electrical parameters including at least one of the current passing though the primary winding, a voltage across the primary winding, an average power in the primary winding, and a peak power in the primary winding.

32. The method of claim 26 further comprising the step of adjusting a magnitude of the current generated by the solid state AC switching power supply from the measured electrical parameters and from predetermined operating conditions.

33. The method of claim 26 wherein the pressure is substantially between 1 mtorr and 100 torr.

34. The method of claim 26 wherein an electric field of the plasma is substantially between 1–100 V/cm.

35. A method for cleaning a process chamber, the method comprising:
   a. flowing a gas in a chamber at a pressure;
   b. generating a current with a solid state AC switching power supply;
   c. inducing an AC potential inside the chamber by passing the current though a primary winding of a transformer having a magnetic core surrounding a portion of the chamber, the induced AC potential directly forming a toroidal plasma that completes a secondary circuit of the transformer and dissociates the gas forming chemically active species; and
   d. directing the chemically active species generated by the plasma from the plasma chamber into the process chamber, thereby cleaning the process chamber.

36. The method of claim 35 wherein the reactive gas comprises at least one of an oxygen or a fluorine containing gas.

37. A method for processing materials, the method comprising:
   a. flowing a gas in a chamber at a pressure;
   b. generating a current with a solid state AC switching power supply;
   c. inducing an AC potential inside the chamber by passing the current though a primary winding of a transformer having a magnetic core surrounding a portion of the chamber, the induced AC potential directly forming a toroidal plasma that completes a secondary circuit of the transformer and dissociates the gas; and
   d. exposing material to be processed to the dissociated gas.

38. The method of claim 37 further comprising directing the dissociated gas from the plasma chamber into the process chamber containing the material to be processed.

39. An apparatus for dissociating gases comprising:
   a) a plasma chamber comprising an electrically conductive material and at least one dielectric region that forms an electrical discontinuity that substantially prevents induced current flow from forming in the plasma chamber itself, the plasma chamber further comprising an inlet for providing a gas;
   b) a transformer having a magnetic core surrounding a portion of the plasma chamber and a primary winding; and
   c) an AC power supply having an output electrically connected to the primary winding, the AC power supply driving current in the primary winding, the current inducing an AC potential inside the plasma chamber that directly forms a toroidal plasma which completes a secondary circuit of the transformer and dissociates the gas.

40. The apparatus of claim 39 wherein the chamber comprises aluminum.

41. The apparatus of claim 40 wherein the aluminum is anodized.

42. The apparatus of claim 39 wherein the chamber comprises cooling channels for passing a fluid that controls the temperature of the chamber.

43. The apparatus of claim 39 wherein the AC power supply comprises one or more switching semiconductor devices directly coupled to a voltage supply and having an output coupled to the primary winding.

44. An apparatus for dissociating gases, the apparatus comprising:
   a. a plasma chamber comprising a gas;
   b. a primary winding of a transformer magnetically coupled to a portion of the plasma chamber; and
   c. a solid state AC switching power supply comprising one or more switching semiconductor devices coupled to a voltage supply and having an output coupled to the primary winding of the transformer,
   the solid state AC switching power supply driving an AC current in the primary winding, the current inducing an AC potential inside the chamber that directly forms a toroidal plasma that completes a secondary circuit of the transformer and dissociates the gas.

45. The apparatus of claim 44 herein the transformer comprises a magnetic core surrounding a portion of the plasma chamber and the primary winding surrounds a portion of the magnetic core.

46. An apparatus for activating gases, the apparatus comprising:
   a. a plasma chamber comprising a gas;
   b. a primary winding of a transformer magnetically coupled to a portion of the plasma chamber; and
   c. a solid state AC switching power supply comprising one or more switching semiconductor devices coupled to a voltage supply and having an output coupled to the primary winding of the transformer,
   the solid state AC switching power supply driving an AC current in the primary winding, the current inducing an AC potential inside the chamber that directly forms a toroidal plasma that completes a secondary circuit of the transformer and activates the gas.

47. The apparatus of claim 46 wherein the transformer comprises a magnetic core surrounding a portion of the plasma chamber and the primary winding surrounds a portion of the magnetic core.

48. A downstream plasma source comprising:
   a) a metallic plasma chamber coupled to a process chamber having a material disposed therein;
   b) at least one dielectric region that forms an electrical discontinuity that substantially prevents induced current flow from forming in the plasma chamber itself;
   c) a transformer having a magnetic core surrounding a portion of the plasma chamber and a primary winding;
   d) a gas inlet for providing a feed gas to the plasma chamber; and
   e) an AC power supply having an output connected to the primary winding, the AC power supply driving an AC current in the primary winding, the AC current inducing an AC potential inside the plasma chamber that directly forms a toroidal plasma that completes a secondary circuit of the transformer and dissociates the feed gas, the dissociated feed gas flowing downstream into the process chamber for processing the material disposed therein.

49. A downstream plasma source for cleaning a process chambers the downstream plasma source comprising:
   a) a metallic plasma chamber coupled to a process chamber;
   b) at least one dielectric region that forms an electrical discontinuity that substantially prevents induced current flow from forming in the plasma chamber itself;

c) a transformer having a magnetic core surrounding a portion of the plasma chamber and a primary winding;

d) a gas inlet for providing a feed gas to the plasma chamber; and e) an AC power supply having an output connected to the primary winding, the AC power supply driving an AC current in the primary winding, the AC current inducing an AC potential inside the plasma chamber that directly forms a toroidal plasma that completes a secondary circuit of the transformer and dissociates the feed gas, the dissociated feed gas flowing into the process chamber for cleaning the process chamber.

50. A downstream plasma source for cleaning a process chamber, the downstream plasma source comprising:

a) a plasma chamber coupled to a process chamber;

b) a transformer having a magnetic core surrounding a portion of the plasma chamber and a primary winding;

c) a gas inlet for providing a feed gas to the plasma chamber; and d) an AC switching power supply having an output coupled to the primary winding, the AC switching power supply driving an AC current in the primary winding with a sinusoidal waveform, the AC current inducing an AC potential inside the plasma chamber that directly forms a toroidal plasma that completes a secondary circuit of the transformer and dissociates the feed gas, the dissociated feed gas flowing into the process chamber for cleaning the process chamber.

51. A downstream plasma source comprising:

a) a plasma chamber having at least one side exposed to a process chamber having a material disposed therein;

b) a transformer having a magnetic core surrounding a portion of the plasma chamber and a primary winding;

c) a gas inlet for providing a feed gas to the plasma chamber; and d) an AC switching power supply having an output connected to the primary winding, the AC switching power supply driving an AC current in the primary winding, the AC current inducing an AC potential inside the plasma chamber that directly forms a toroidal plasma that completes a secondary circuit of the transformer and dissociates the feed gas, the dissociated feed gas and charged particles generated by the plasma flowing into the process chamber for processing the material disposed therein.

\* \* \* \* \*

UNITED STATES PATENT AND TRADEMARK OFFICE
CERTIFICATE OF CORRECTION

PATENT NO.    : 6,486,431 B1                                                    Page 1 of 1
DATED         : November 26, 2002
INVENTOR(S)   : Smith et al.

It is certified that error appears in the above-identified patent and that said Letters Patent is hereby corrected as shown below:

Column 14,
Line 19, please delete "herein" and insert in its place -- wherein --.
Line 62, please delete "chambers" and insert in its place -- chamber, --.

Signed and Sealed this

First Day of July, 2003

JAMES E. ROGAN
*Director of the United States Patent and Trademark Office*